United States Patent
Furumiya et al.

(10) Patent No.: US 8,330,254 B2
(45) Date of Patent: Dec. 11, 2012

(54) SEMICONDUCTOR DEVICE

(75) Inventors: Masayuki Furumiya, Kanagawa (JP);
Hiroaki Ohkubo, Kanagawa (JP);
Fuyuki Okamoto, Kanagawa (JP);
Masayuki Mizuno, Tokyo (JP); Koichi Nose, Tokyo (JP); Yoshihiro Nakagawa, Tokyo (JP); Yoshio Kameda, Tokyo (JP)

(73) Assignees: Renesas Electronics Corporation, Kanagawa (JP); NEC Corporation, Tokyo (JP)

( * ) Notice: Subject to any disclaimer, the term of this patent is extended or adjusted under 35 U.S.C. 154(b) by 264 days.

(21) Appl. No.: 12/647,639

(22) Filed: Dec. 28, 2009

(65) Prior Publication Data
US 2010/0164053 A1 Jul. 1, 2010

(30) Foreign Application Priority Data
Dec. 26, 2008 (JP) .................................. 2008-333090

(51) Int. Cl.
*H01L 23/544* (2006.01)
(52) U.S. Cl. ................ 257/620; 257/503; 257/E23.179; 257/E29.007; 257/400
(58) Field of Classification Search .................. 257/400, 257/503, 620, E23.179, E29.007
See application file for complete search history.

(56) References Cited

U.S. PATENT DOCUMENTS
2005/0272226 A1* 12/2005 Kwon ........................... 438/462
2008/0191205 A1* 8/2008 Tsai et al. ........................ 257/48

FOREIGN PATENT DOCUMENTS
JP 2005-030877 2/2005

* cited by examiner

Primary Examiner — Kimberly D Nguyen
Assistant Examiner — Timor Karimy
(74) Attorney, Agent, or Firm — Young & Thompson

(57) ABSTRACT

A semiconductor device includes a semiconductor wafer in which semiconductor chip forming regions and a scribe region located between the semiconductor chip forming regions are formed, a plurality of semiconductor chip circuit portions provided over the semiconductor wafer, a plurality of first conductive layers, provided in each of the semiconductor chip forming regions, which is electrically connected to each of the circuit portions, and a first connecting portion that electrically connects the first conductive layers to each other across a portion of the scribe region. An external power supply or grounding pad is connected to any one of the first conductive layer and the first connecting portion. The semiconductor device includes a communication portion, connected to the circuit portion, which performs communication with the outside by capacitive coupling or inductive coupling.

3 Claims, 9 Drawing Sheets

SEMICONDUCTOR DEVICE

The application is based on Japanese patent application No. 2008-333090, the content of which is incorporated hereinto by reference.

BACKGROUND

1. Technical Field

The present invention relates to a semiconductor device.

2. Related Art

In the past, in a manufacturing procedure of semiconductor chips, testing of circuit portions may be performed in a state where a plurality of semiconductor chip circuit portions is formed over semiconductor wafers.

At this time, a method of performing the testing of the circuit portions through communication with external devices in a non-contact manner is proposed (see, for example, Japanese Laid-Open Patent Publication NO. 2005-30877).

When such testing is performed, it is difficult to perform even the supplying of power or grounding in a non-contact manner. For this reason, pads connected to the circuit portions respectively are formed, power is supplied by probing on these pads, or grounding is performed by probing on these pads. Even though communication with the external devices is performed in a non-contact manner, a pin is placed on the respective pads which are connected for each circuit portion, and then the supplying of power is performed, or grounding is performed, which results in time-consuming effort being generated in the case of performance in a contact manner. In other words, there occurs a problem that time-consuming effort is required to align a large number of pads and a large number of pins.

Consequently, in Japanese Laid-Open Patent Publication NO. 2005-30877, there has been proposed a semiconductor device 100 as shown in FIG. 15. In this semiconductor device 100, each of the semiconductor chips 104 is connected to interconnects 101 and 102 in a scribe region.

The supplying of power is performed through these interconnects 101 and 102, and grounding is performed through these interconnects 101 and 102, so that placing the pin on the power supply pad of a portion of the semiconductor chip 104 allows power to be supplied.

However, in the semiconductor device 100 disclosed in Japanese Laid-Open Patent Publication NO. 2005-30877, there occurs the following problem.

In this semiconductor device 100, the interconnects 101 and 102 are drawn throughout the scribe region. Therefore, when the dicing of the semiconductor device 100 is performed for each semiconductor chip 104, a large amount of interconnect debris is generated. Such large amounts of debris are attached to the semiconductor chip, thereby having significant influence on the performance of the semiconductor chip.

Typically, a circuit for checking the performance of transistors inside the semiconductor chip, or an alignment mark and the like, is formed in the scribe region. Therefore, as in Japanese Laid-Open Patent Publication NO. 2005-30877, drawing the power supply interconnects throughout the entire scribe region is in practice troublesome.

SUMMARY

In one embodiment, there is provided a semiconductor device including: a semiconductor wafer having a plurality of semiconductor chip forming regions and a scribe region located between the semiconductor chip forming regions, a semiconductor chip circuit portion that is provided in each of the semiconductor chip forming regions of the semiconductor wafer, a plurality of first conductive layers, provided in each of the semiconductor chip forming regions, which is electrically connected to each of the circuit portions respectively, a first connecting portion that electrically connects the first conductive layers to each other across a portion of the scribe region, and a communication portion, connected to the circuit portion, that performs signal communication with the outside by capacitive coupling or inductive coupling, wherein an external power supply or grounding pad is connected to at least one of the first conductive layer and the first connecting portion.

According to the invention, the semiconductor device includes the first conductive layers electrically connected to each of the circuit portions of the semiconductor chips, and the first connecting portion that electrically connects the first conductive layers to each other across a portion of the scribe region of the semiconductor wafer. An external power supply or grounding pad is connected to at least one of the first conductive layer and the first connecting portion.

Therefore, it is possible to perform the supply of power to a plurality of semiconductor chip circuit portions, or to perform grounding, through one pad.

Herewith, as in the semiconductor device according to the related art, it is possible to obviate the time-consuming alignment of a large number of pads and a large number of pins.

In the semiconductor device according to the invention, when the testing of the circuit portion is performed, it is possible to perform communication with the outside in a non-contact manner by capacitive coupling or inductive coupling, and to perform the supplying of power to a plurality of semiconductor chip circuit portions, or to perform grounding, through one pad. Therefore, when the testing of the circuit portion of the semiconductor device is performed, it is possible to positively obviate the time-consuming alignment of a large number of pads and a large number of pins, and to easily perform the test.

Moreover, it is possible to reduce the number of the pads compared to the semiconductor device according to the related art.

Further, in the invention, it is possible to stably manufacture the semiconductor chip.

This is due to the following reason.

The connecting portion which connects the first conductive layers to each other is disposed across a portion of the scribe region.

Since the interconnect is not formed throughout the scribe region, it is possible to suppress the occurrence of a large amount of debris when dicing is performed. Herewith, it is possible to prevent a decrease in the performance of the semiconductor chip and the like, and to stably manufacture the semiconductor chip.

Moreover, since the first connecting portion is disposed across a portion of the scribe region, it does not obstruct a circuit formed in the scribe region for checking the performance of transistors inside the semiconductor chip, or an alignment mark and the like. Herewith, it is possible to contrive the effective utilization of the scribe region.

According to the invention, there is provided a semiconductor device capable of performing the testing of the circuit portion without requiring time-consuming effort, capable of contriving the effective utilization of the scribe region, capable of stably manufacturing the semiconductor chip, and capable of performing communication with the outside in a non-contact manner.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

Figure 1:
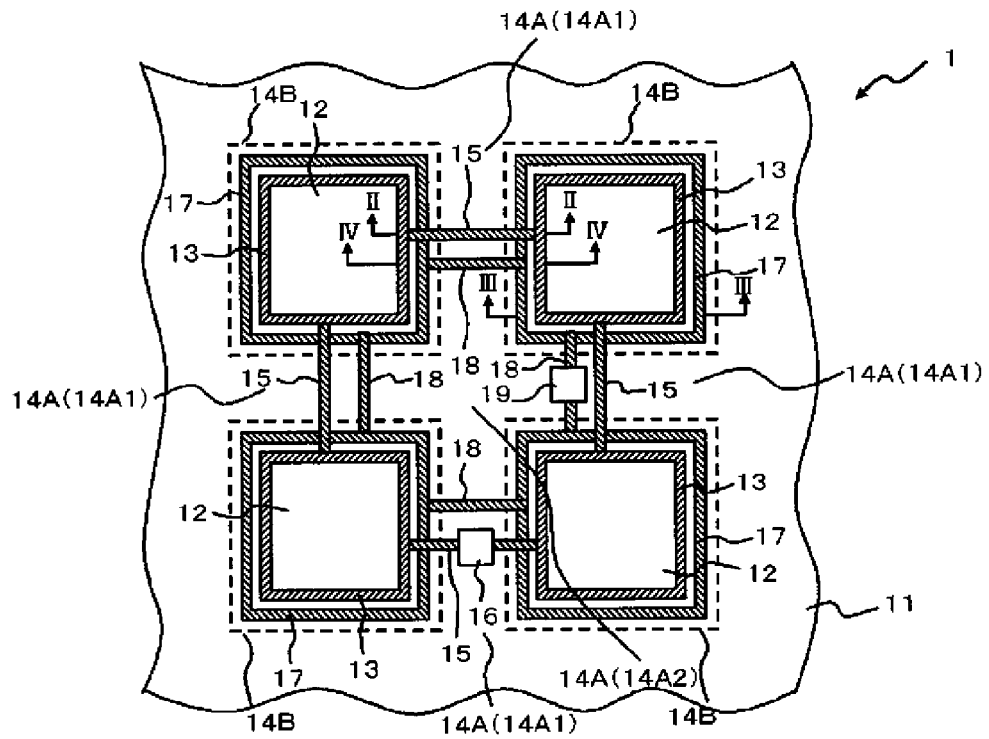
FIG. 1 is a diagram schematically illustrating a plan view of the semiconductor device according to a first embodiment of the invention.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereinafter, preferred embodiments according to the invention will be described with reference to the accompanying drawings. In all the drawings, like elements are referenced by like reference numerals and descriptions thereof will not be repeated.

First Embodiment

Hereinafter, preferred embodiments according to the invention will be described with reference to the accompanying drawings.

First of all, an outline of the semiconductor device 1 of this embodiment will be explained with reference to FIG. 1. FIG. 1 is a diagram schematically illustrating a plan view of the semiconductor device 1.

The semiconductor device 1 according to the embodiment includes a semiconductor wafer 11 having a plurality of semiconductor chip forming regions 14B and a scribe region 14A located between the semiconductor chip forming regions 14B, a plurality of semiconductor chip circuit portions 12 provided on the semiconductor wafer 11, a plurality of first conductive layers 13, provided in each of the semiconductor chip forming regions 14B, which is electrically connected to each of the circuit portions 12, and a first connecting portion 15 which electrically connects the first conductive layers 13 to each other across a portion of the scribe region 14A.

An external power supply or grounding pad 16 is connected to at least one of the first conductive layer 13 and the first connecting portion 15.

Figure 5:
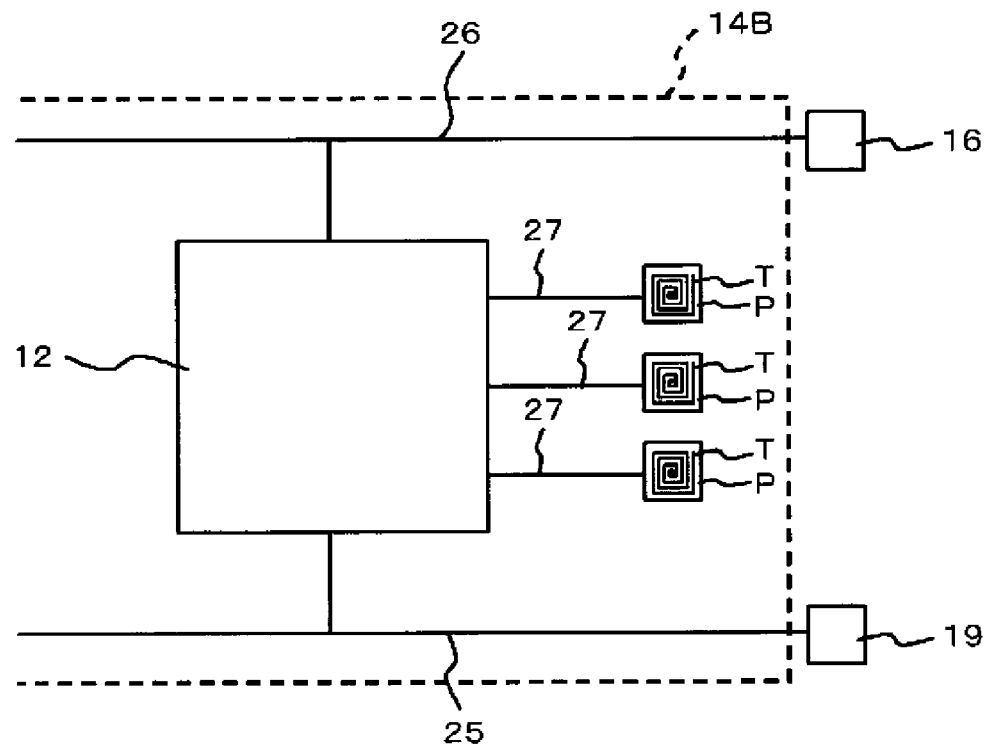
FIG. 5 is a diagram schematically illustrating a relationship between a pad and a circuit portion of semiconductor device.

This semiconductor device 1 further includes a communication portion T, connected to the circuit portion 12, which performs communication with the outside by capacitive coupling or inductive coupling (see FIG. 5).

Next, details of the semiconductor device 1 according to the embodiment will be described.

The semiconductor device 1 includes a second conductive layer 17, a second connecting portion 18, and a pad 19, in addition to the semiconductor wafer 11, the circuit portion 12, the first conductive layer 13, the first connecting portion 15, the pad 16, and the communication portion T which are mentioned above.

The semiconductor wafer 11, for example, is a silicon wafer. A plurality of semiconductor chip forming regions 14B is formed on this semiconductor wafer 11, and the scribe region 14A is provided between the opposite semiconductor chip forming regions 14B.

The semiconductor chip forming regions 14B are regions surrounded by the dotted lines of FIG. 1. In the embodiment, four or more semiconductor chip forming regions are formed, and are arranged in a matrix. Here, they are arranged in a matrix of n rows×m columns (n, m≧2).

In addition, a plurality of scribe regions 14A is formed on the semiconductor wafer 11. In FIG. 1, among the scribe regions 14A, four scribe regions 14A1 located between a pair of semiconductor chip forming regions 14B, and one scribe region 14A2 sandwiched among four semiconductor chip forming regions 14B are shown. The scribe regions are formed as a whole in a lattice by the scribe regions 14A1 and the scribe region 14A2.

The semiconductor chip circuit portion 12 is formed in each of the semiconductor chip forming regions 14B.

The planar ring-shaped first conductive layer 13 is provided inside of the semiconductor chip forming region 14B and at the circumference of the circuit portion 12 so as to wholly surround the periphery of the circuit portion 12.

Figure 2:
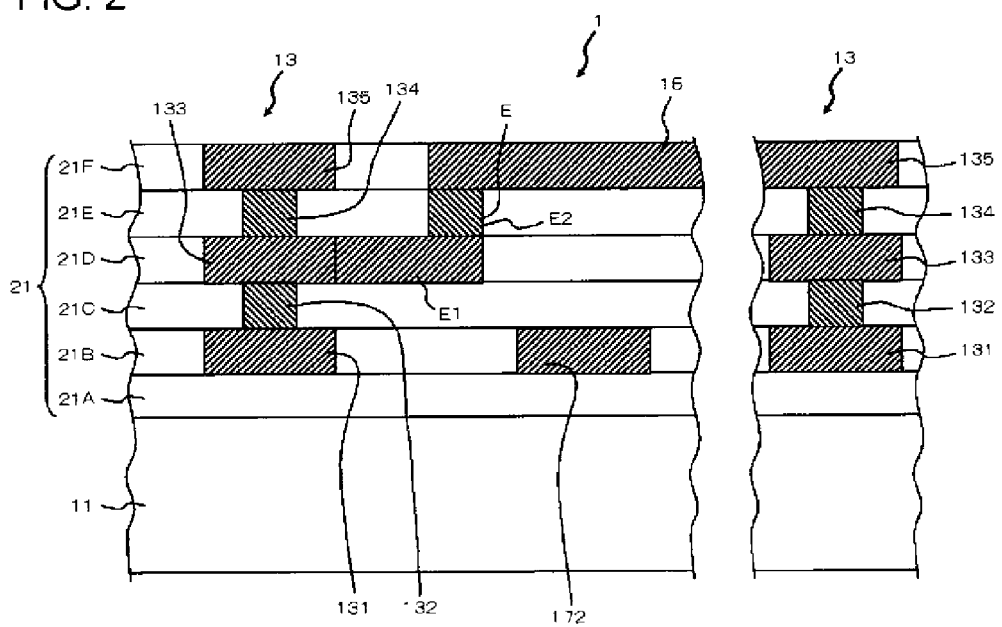
FIG. 2 is a cross-section view taken along an II-II direction of FIG. 1.

The first conductive layer 13 is a seal ring 13. As shown in a cross-section view of FIG. 2, this seal ring 13 is formed in an insulating layer 21 provided on the semiconductor wafer 11. FIG. 2 is a cross-section view taken along an II-II direction of FIG. 1.

The insulating layer 21 covers the semiconductor chip forming regions 14B and the scribe regions 14A of the semiconductor wafer 11. This insulating layer 21 is a layer in which first to sixth insulating interlayers 21A to 21F are stacked from the semiconductor wafer 11 side. Meanwhile, a passivation film, which is not shown, is formed on the sixth insulating interlayer 21F.

The first insulating interlayer 21A is a silicon oxide film, and the second to the sixth insulating interlayers 21B to 21F are Low-K layers of which the dielectric constants are lower than that of the silicon oxide film.

The seal ring 13 includes a metal layer 131 formed in the second insulating interlayer 21B, a via 132 formed in the third insulating interlayer 21C, a metal layer 133 formed in the fourth insulating interlayer 21D, a via 134 formed in the fifth insulating interlayer 21E, and a metal layer 135 formed in the sixth insulating interlayer 21F.

The metal layers 131, 133 and 135, and the via 132 and 134 are, for example, copper-based conductors.

Meanwhile, the seal ring 13 is not formed in the first insulating interlayer 21A, and the seal ring 13 is insulated from the semiconductor wafer 11 by the first insulating interlayer 21A.

This metal layer 131 of the seal ring 13 is connected to an interconnect provided in the circuit portion 12, which is not shown.

Figure 3:
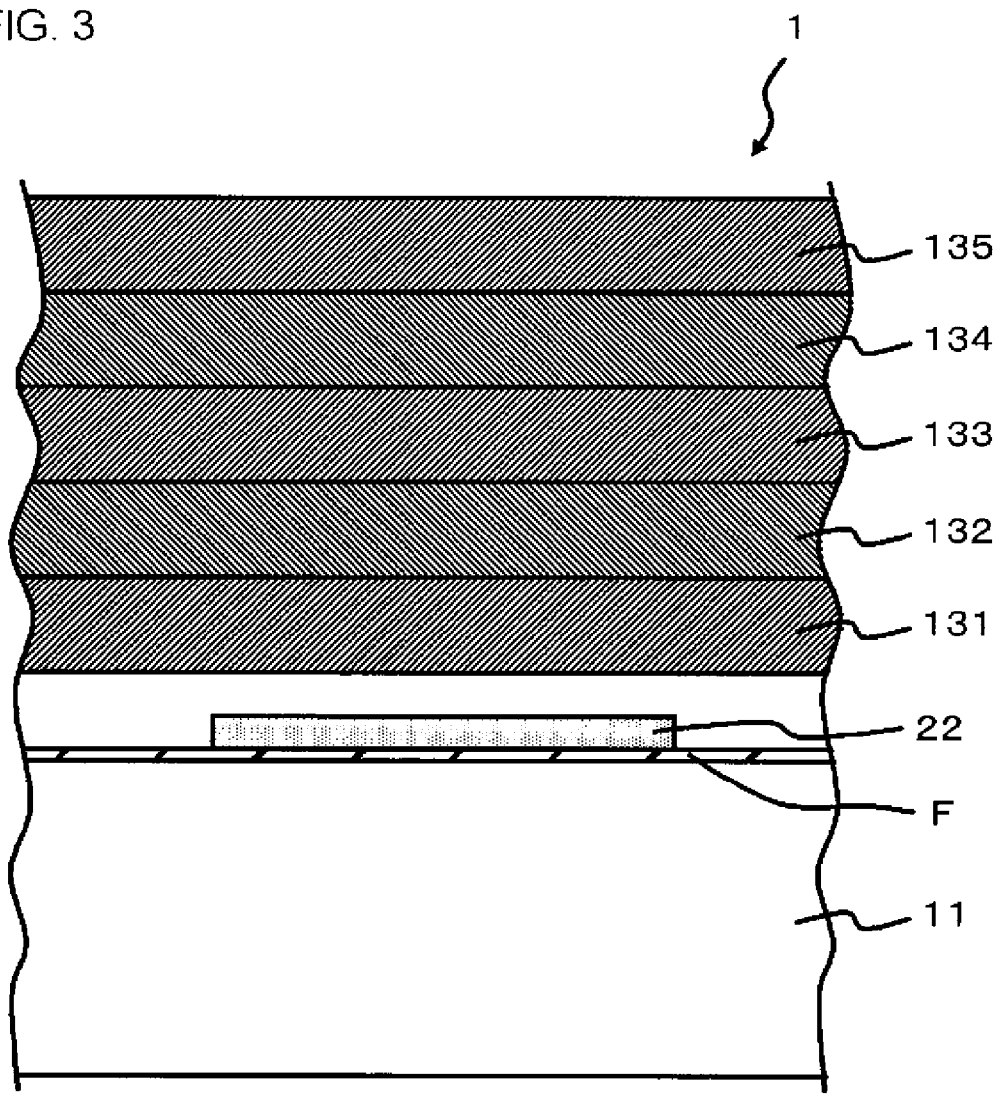
FIG. 3 is a cross-section view taken along an III-III direction of FIG. 1.

In addition, the seal ring 13 is formed in a flat-surface rectangular frame as shown in FIG. 1. Further, this seal ring 13 is formed in a slit shape (wall shape), and wholly surrounds the periphery of the circuit portion 12, as shown in FIG. 3 which is a cross-section view taken along an III-III direction of FIG. 1.

The seal rings 13 which are oppositely disposed to be adjacent to each other (seal rings 13 adjacent in a row direction and a column direction of the semiconductor chip forming region 14B disposed in a matrix) are connected to each other by the first conductive connecting portion 15. Here, the first connecting portion 15 is a metal layer, for example, a copper-based layer. Herewith, in the embodiment, all of the circuit portions 12 are electrically connected to each other through the seal ring 13 and the first connecting portion 15.

The first connecting portion 15 is formed in the sixth insulating interlayer 21F, and connects the opposite regions of a pair of opposite seal rings 13, in particular, a pair of opposite sides thereof, to each other.

Moreover, the first connecting portion 15 is disposed so as to be across the scribe region 14A1 between each of the semiconductor chip forming regions 14B. The first connecting portion 15 is disposed so as to be across only a portion of the scribe region 14A1, and is not formed throughout the scribe region 14A1.

In addition, when the semiconductor wafer 11 is seen in a plan view, the first connecting portion 15 is extended in a direction intersecting a longer direction (direction along a dicing line) of the scribe region 14A1 (here, a substantially orthogonal direction to the longer direction of the scribe region 14A1), and a longer direction of the first connecting portion 15 intersects (orthogonal to) a longer direction (dicing line) of the scribe region 14A1.

Meanwhile, in the embodiment, a power supply interconnect and a grounding interconnect extended along the dicing line are not disposed in the scribe regions 14A1 and 14A2.

Further, the pad 16 is provided over the first connecting portion 15. This pad 16 is provided on the above-mentioned passivation film, and is connected to the first connecting portion 15 through a contact passing through an opening formed in the passivation film.

An electric fuse E is provided between the first connecting portion 15 and the seal ring 13 (see FIG. 2).

This electric fuse E is a unit which cuts off the electrical connection of the first connecting portion 15 and the seal ring 13. When a large current flows in the circuit portion 12, the electric fuse E is cut off to protect another circuit portion 12 from the large current.

In the embodiment, the electric fuse E is configured to connect the metal layer 133 of the seal ring 13 and the first connecting portion 15. The electric fuse E includes a first region E1 extending from the metal layer 133, and a second region E2 extending from the first region E1 toward the first connecting portion 15, and is substantially L-shaped when seen in a cross section view.

As shown in FIG. 1, the pad 16 is used for supplying power from the outside, and power is supplied through this pad 16. The pad 16 is disposed in the scribe region 14A.

The pad 16 may be connected to a portion of the first connecting portion 15, and does not need to be provided on each of the first connecting portions 15.

Once again, as shown in FIG. 1, the second conductive layer 17 is disposed at the circumference of the seal ring 13, and is provided in a ring shape so as to surround each of the seal rings 13. In the embodiment, the second conductive layer 17 is formed in a flat-surface rectangular frame, similarly to the seal ring 13.

Figure 4:
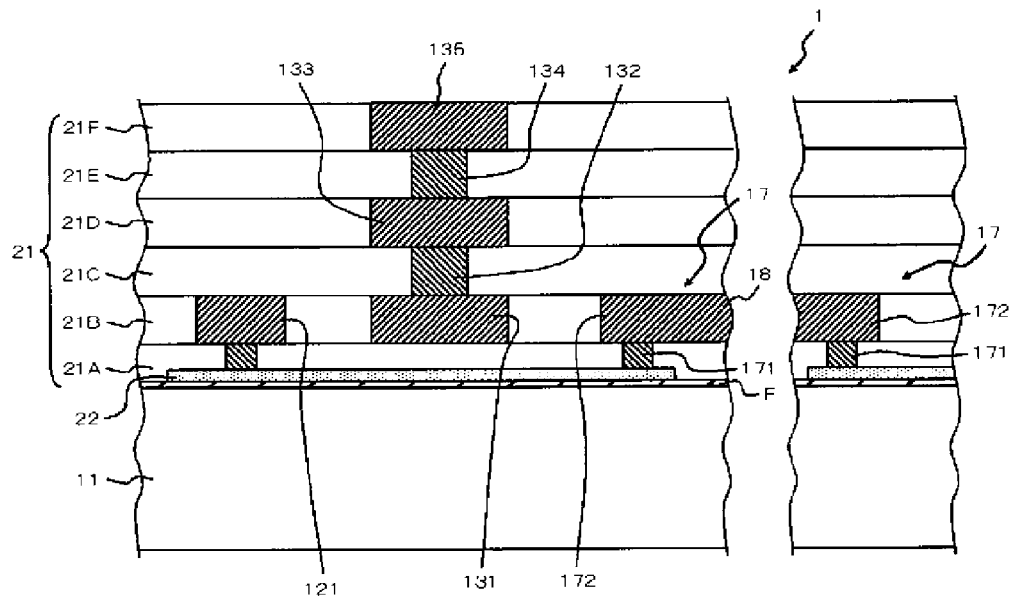
FIG. 4 is a cross-section view taken along an IV-IV direction of FIG. 1.

As shown in FIG. 4, the second conductive layer 17 includes a via 171 formed in the first insulating interlayer 21A, and a metal layer 172 formed in the second insulating interlayer 21B. Both the via 171 and the metal layer 172 are copper-based conductors.

The metal layer 172 is formed in a flat-surface rectangular frame, and the via 171 is disposed in a scattered manner at predetermined intervals.

The via 171 formed in the first insulating interlayer 21A is connected to the polysilicon film 22 within the first insulating interlayer 21A. The polysilicon film 22 is extended so as to be orthogonal to the sides of the seal ring 13 or the second conductive layer 17, and is substantially rectangular when seen in a plan view. This polysilicon film 22 is connected to an interconnect 121 of the circuit portion 12 through the lower side of one side of the seal ring 13. When a gate electrode is formed, this polysilicon film 22 can be simultaneously formed. Meanwhile, a gate insulating film F is disposed between the polysilicon film 22 and the substrate 11.

As shown in FIG. 1, the second conductive layers 17 adjacently facing each other, among the second conductive layers 17, are electrically connected by the second connecting portion 18 of the metal layer 172.

The second connecting portion 18 is formed in the second insulating interlayer 21B. In addition, the second connecting portion 18 connects opposite regions of a pair of the opposite second conductive layers 17, in particular, a pair of the opposite sides thereof, to each other, similarly to the first connecting portion 15.

Further, the second connecting portion 18 is disposed so as to be across the scribe region 14A1 between each of the semiconductor chip forming regions 14B. The second connecting portion 18 is disposed so as to be across only a portion of the scribe region 14A1, but not formed throughout the scribe region 14A1.

In addition, when the semiconductor wafer 11 is seen in a plan view, the second connecting portion 18 is extended in a direction intersecting a longer direction (direction along the dicing line) of the scribe region 14A1 (here, a substantially orthogonal direction to the longer direction of the scribe region 14A1), and a longer direction of the second connecting portion 18 intersects (orthogonal to) a longer direction (dicing line) of the scribe region 14A1.

Further, a pad 19 is provided over the second connecting portion 18. This pad 19 is provided over the above-mentioned passivation film, and is connected to the second connecting portion 18 through the contact (not shown) penetrating the opening formed in passivation film, and moreover, penetrating the third insulating interlayer 21C, the fourth insulating interlayer 21D, the fifth insulating interlayer 21E, and the sixth insulating interlayer 21F.

This pad 19 is used for grounding. This pad 19 is disposed in the scribe region 14A. The pad 19 may also be connected to a portion of the second connecting portion 18, and does not need to be provided over each of the second connecting portions 18.

Further, as shown in FIG. 5, the semiconductor device 1 includes the communication portion T in each of the semiconductor chip forming regions 14B. This communication portion T is connected to the circuit portion 12. Here, the communication portion T is an inductor, and is formed in, for example, the insulating film 21E. A bonding pad P is stacked over the communication portion T through the insulating film 21F and the like.

A plurality of communication portions T is connected to one circuit portion 12. The communication portion T performs communication with the outside in a non-contact manner by electromagnetic induction. Meanwhile, in FIG. 5, reference numeral 26 shows a power supply line (including the seal ring 13, or the first connecting portion 15), reference numeral 27 shows a signal line which connects the circuit portion 12, and the communication portion T or the bonding pad P, and reference numeral 25 shows a ground line (including the seal ring 17 and the second connecting portion 18).

Figure 6:
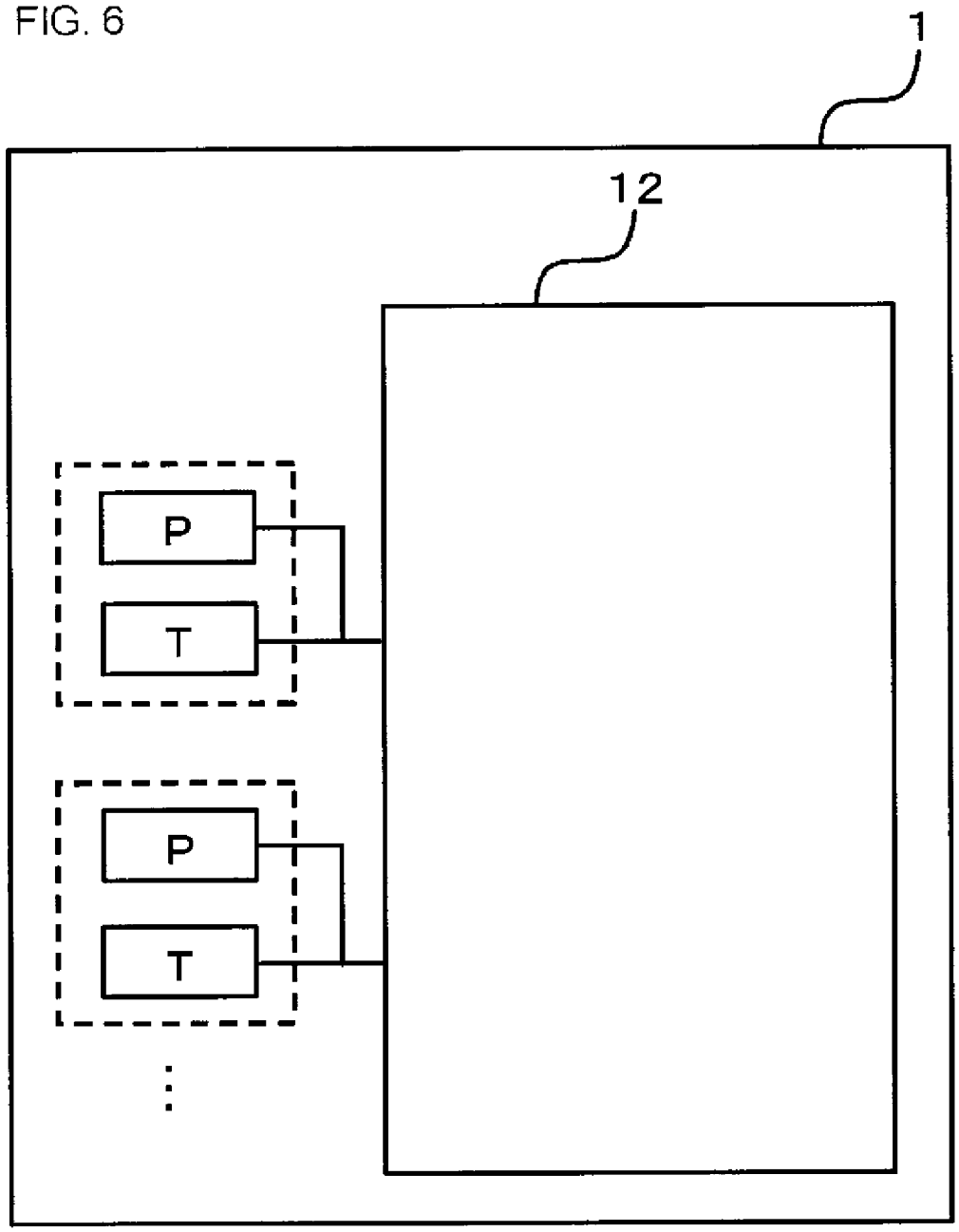
FIG. 6 is a block diagram illustrating a relationship between the circuit portion, a bonding pad, and a communication portion according to the first embodiment.

FIG. 6 shows the configuration circuit of the semiconductor device 1. The communication portion T and the bonding pad P are connected to the circuit portion 12 respectively. In addition, each of the communication portions T is connected to different regions of the circuit portion 12.

Meanwhile, in the embodiment, there exists the communication portion T which performs communication with the outside in a non-contact manner within each of the semiconductor chip forming regions 14B. However, there may exist a communication portion which performs communication with the outside in a contact manner within a portion of the semiconductor chip forming region 14B, without being limited to this.

Figure 8:
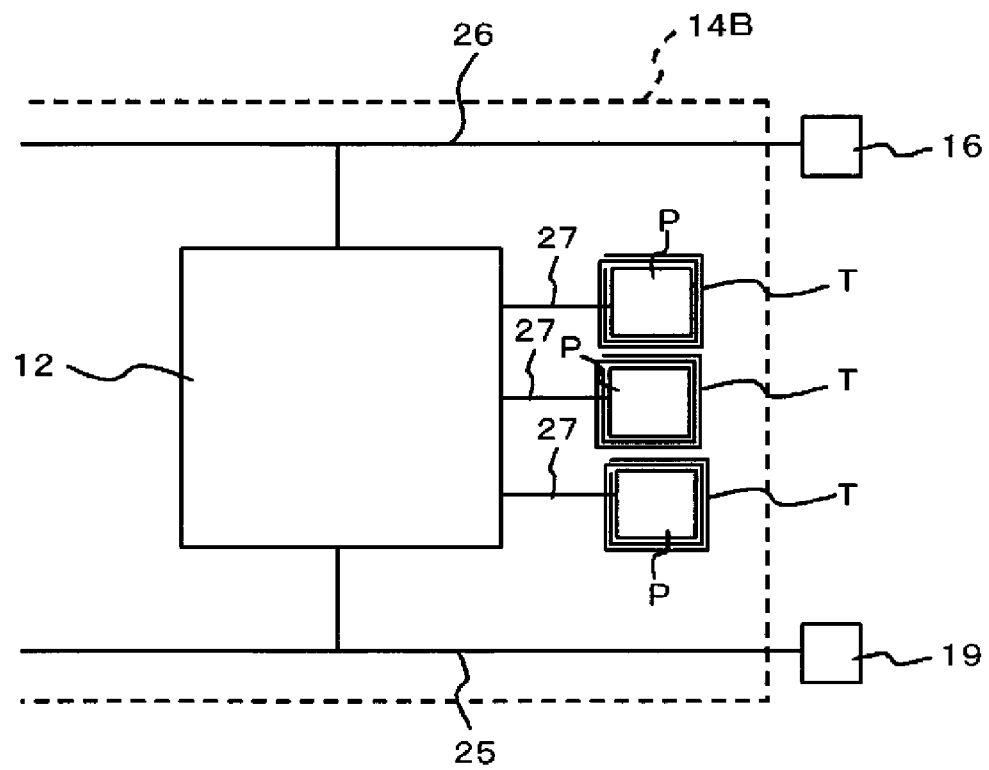
FIG. 8 is a diagram schematically illustrating a relationship between the pad and the circuit portion of the semiconductor device.

In addition, here, the communication portion T is stacked on the bonding pad P. However, as shown in FIG. 8, the communication portion T may be provided at the circumference of the bonding pad P in the semiconductor chip forming region 14B, without being limited to this. Here, the communication portion T is provided so as to surround the circumference of the bonding pad P.

Next, a method of testing such a semiconductor device 1 will be described.

First, an operation is executed for placing a probe pin on one pad 16 and supplying power-supply voltage.

Meanwhile, an operation is executed for placing the probe pin on one pad 19 and grounding it.

Since the pad 16 is connected to the first connecting portion 15, power is supplied to two seal rings 13 through the first connecting portion 15. Moreover, since the seal ring 13 is connected to the other seal ring 13 through the first connecting portion 15, power is supplied to the other seal ring 13 as well.

On the other hand, each of the seal rings 13 is connected to each of the circuit portion 12, and further, each of the circuit portions 12 is connected to the pad 19 through the polysilicon film 22, the second conductive layer 17, and the second connecting portion 18.

With such a configuration, power is supplied to each of the circuit portions 12, thereby allowing each of the circuit portions 12 to be driven.

Figure 7:
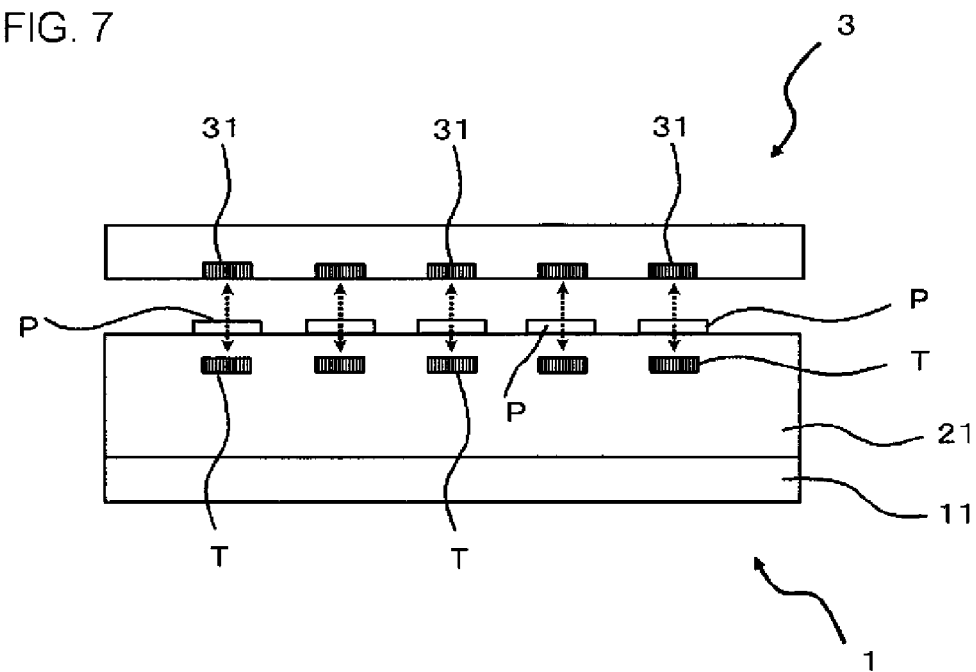
FIG. 7 is a diagram schematically illustrating a state where testing of the semiconductor device is performed.

Next, as shown in FIG. 7, an operation is executed for moving the tester 3 close to the semiconductor device 1. This tester 3 includes a plurality of inductors 31. In order for the inductors 31 of the tester 3 to be opposite to the communication portions T of the semiconductor device 1, an operation is executed for disposing the inductors so as not to put the tester 3 in contact with the semiconductor device 1. After this, an operation is executed for outputting each of the test signals from the inductors 31 of the tester 3 side to the semiconductor device 1. The communication portions T of the semiconductor device 1 side convert the signals from the inductors of the tester 3 side into the electrical signals, and supply the signals to the circuit portion 12. Herewith, the circuit portion 12 is driven, and the testing of the semiconductor device 1 is performed.

Meanwhile, here, the signals are transmitted from the tester 3 side toward the semiconductor device 1. However, the signals may be transmitted from the semiconductor device 1 side toward the tester side, without being limited to this.

After the testing described above is finished, the semiconductor device 1 is diced for each semiconductor chip. Since the first connecting portion 15, the second connecting portion 18, and the pads 16 and 19 are provided in the scribe region 14A, they are cut off at the time of dicing.

Next, the effect of the embodiment will be described.

The semiconductor device 1 includes the seal ring 13 electrically connected to the circuit portion 12 of each semiconductor chip, and the first connecting portion 15 connecting the seal rings 13 to each other. In addition, the semiconductor device 1 includes the second conductive layer 17 connected to the circuit portion 12 of each semiconductor chip, and the second connecting portion 18 connecting each of the second conductive layers 17 to each other.

The power supply pad 16 is connected to a portion of the first connecting portion 15, and the grounding pad 19 is connected to a portion of the second connecting portion 18.

Therefore, it is possible to simultaneously supply power to a plurality of circuit portions 12 by placing the power supply probe pin in contact with the power supply pad 16, and placing the grounding probe pin in contact with the grounding pad 19.

Herewith, it is possible to obviate the time-consuming alignment of a large number of pads and a large number of pins similar to the semiconductor device according to the related art. Moreover, it is possible to reduce the number of the pads compared to the semiconductor device according to the related art.

In addition, the semiconductor device 1 includes the seal ring 13 electrically connected to the circuit portion 12 of semiconductor chip, and the first connecting portion 15 connecting the seal rings 13 to each other. Further, the semiconductor device 1 includes the second conductive layer 17 connected to the circuit portion 12 of semiconductor chip, and the second connecting portion 18 connecting the second conductive layers 17 to each other.

The first connecting portion 15 and the second connecting portion 18 are disposed across a portion of the scribe region 14A of the semiconductor wafer.

When the power supply interconnect is formed throughout the scribe region as in the semiconductor device disclosed in Japanese Laid-Open Patent Publication NO. 2005-30877, a large amount of debris occurs at the time the dicing is performed. However, as in the embodiment, the first connecting portion 15 and the second connecting portion 18 are disposed across a portion of the scribe region 14A, to thereby prevent a large amount of debris from occurring at the time of dicing.

Moreover, since the first connecting portion 15 and the second connecting portion 18 are disposed across a portion of the scribe region 14A, a circuit checking the performance of transistors inside the semiconductor chip, or an alignment mark and the like, which are formed in the scribe region 14A, are not obstructed.

Further, in the embodiment, the seal ring 13 is used for supplying power to the circuit portion 12. This seal ring 13 is used for preventing the permeation of moisture into the circuit portion 12. It is possible to suppress an increase in manufacturing cost without providing new members by supplying power to the circuit portion 12 using such a seal ring 13.

In the embodiment, the first connecting portion 15 connects the opposite sides of a pair of the opposite seal rings 13 to each other, and further is extended in a direction substantially orthogonal to the dicing line of the scribe region 14A1.

Similarly, the second connecting portion 18 also connects the opposite sides of the second opposite conductive layers 17 to each other, and is extended in a direction substantially orthogonal to the dicing line of the scribe region 14A1.

In this way, the lengths of the first connecting portion 15 and the second connecting portion 18 are made relatively shorter, and the proportion of the first connecting portion 15 and the second connecting portion 18 occupying the scribe region 14A1 is made smaller, thereby allowing effective utilization of the scribe region 14A1 to be contrived.

Further, in the embodiment, the polysilicon film 22 is provided within the first insulating interlayer 21A disposed in the lower side of the seal ring 13, the second conductive layer 17 and the circuit portion 12 are connected to each other through this polysilicon film 22. That is, the polysilicon film 22 functions as a grounding interconnect. By this, it is possible to positively drive each of the circuit portions 12 by supplying power without interfering with the seal ring 13 used for supplying power and the polysilicon film 22 used as a grounding interconnect.

In addition, by providing such a polysilicon film 22 without interfering with the seal ring 13, the seal ring 13 can be used for supplying power, and an increase in manufacturing cost can be suppressed without providing new members.

Further, in the embodiment, the seal ring 13 is not provided in the first insulating interlayer 21A. However, since the first insulating interlayer 21A is a silicon oxide film, and therefore is difficult for moisture to pass through, it is possible to protect the circuit portion 12 from moisture even though the seal ring 13 is not provided.

Further, in the embodiment, the bonding pad P and the communication portion T are the stacked structures. As a result, it is possible to effectively dispose the communication portion T and the bonding pad P, and to prevent the semiconductor device 1 from increasing in size.

Further, in the semiconductor device 1 according to the embodiment, a plurality of communication portions T is connected to each one circuit portion 12, and the respective communication portions T are connected to the different regions of the circuit portion 12. Therefore, it is possible to test different regions in the circuit portion 12 at one time.

Second Embodiment

Figure 9:
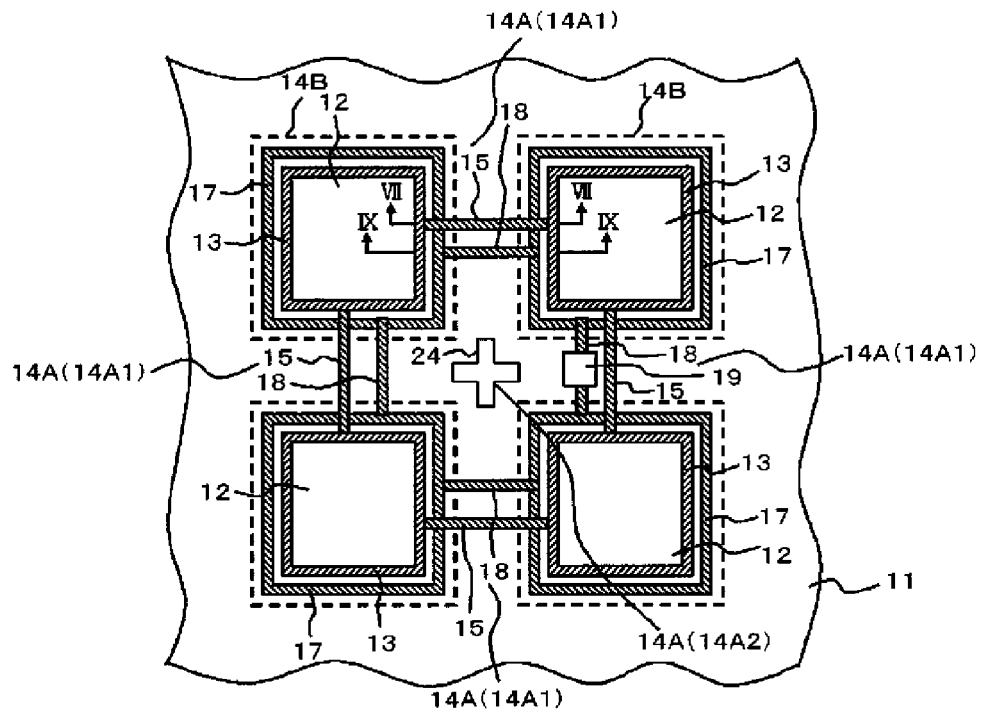
FIG. 9 is diagram schematically illustrating a plan view of the semiconductor device according to a second embodiment of the invention.
Figure 10:
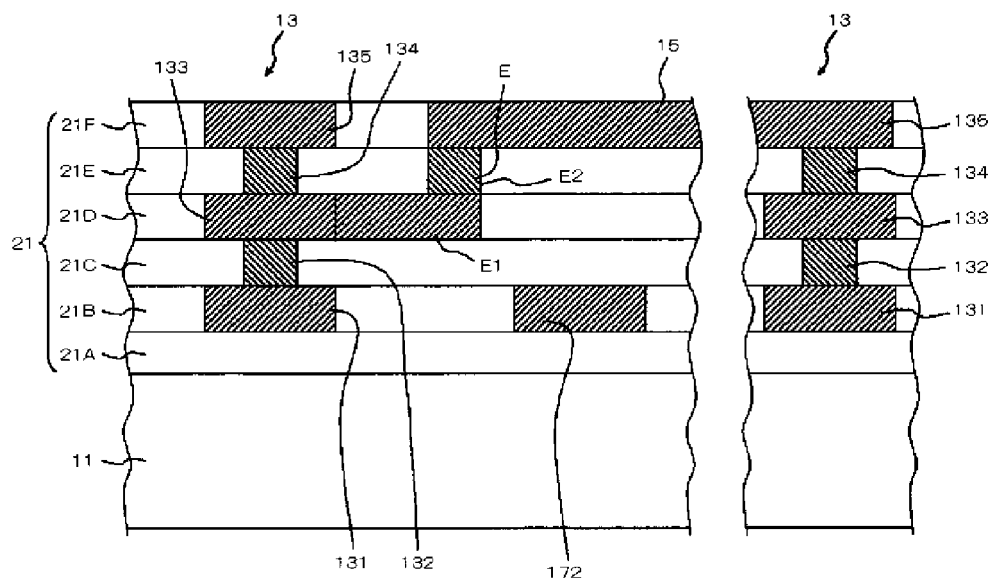
FIG. 10 is a cross-section view taken along an VII-VII direction of FIG. 9.
Figure 11:
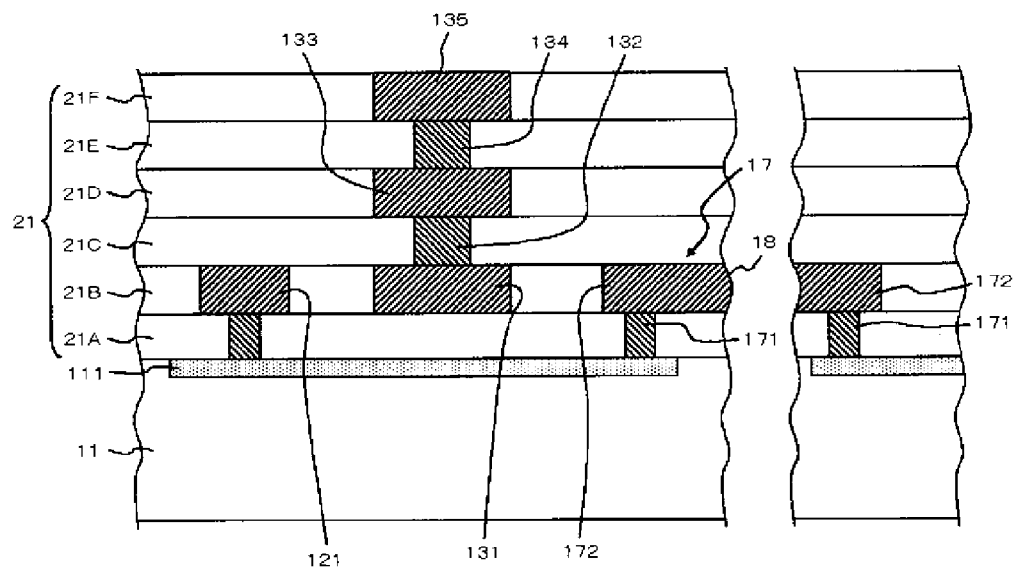
FIG. 11 is a cross-section view taken along an IX-IX direction of FIG. 9.

With reference to FIGS. 9 to 11, a second embodiment according to the invention will be described.

In the first embodiment, the circuit portion 12 and the second conductive layer 17 are connected to each other through the polysilicon film 22. On the other hand, in the embodiment, the circuit portion 12 and the second conductive layer 17 are connected to each other through a well (impurity diffused layer) 111 formed in the surface layer of the semiconductor wafer 11.

Meanwhile, FIG. 10 is a cross-section view taken along a VII-VII direction of FIG. 9. FIG. 11 is a cross-section view taken along an IX-IX direction of FIG. 9.

In addition, the other respects are identical to the above-mentioned embodiment.

Hereinafter, the embodiment will be described in detail.

As shown in FIG. 11, the impurity diffused layer 111 is a layer having impurities diffused in the surface of the semiconductor wafer 11, for example, a P+ impurity diffused layer. The second conductive layer 17 is electrically connected to this impurity diffused layer 111. In addition, the impurity diffused layer 111 and the circuit portion 12 are electrically connected through the interconnect 121.

Therefore, the impurity diffused layer 111 functions as a grounding interconnect in the embodiment.

In the embodiment, as shown in FIG. 9, the pad connected to the first connecting portion 15 becomes an alignment mark 24 provided on an intersection point of the scribe region 14A. This alignment mark 24 is cross-shaped, and a connecting line (not shown) which connects the first connecting portion 15 and the alignment mark 24 is provided in the sixth insulating interlayer 21F.

With such an embodiment, it is possible to exhibit the same effect as that of the above-mentioned embodiment, and then to exhibit the following effect.

Third Embodiment

Figure 12:
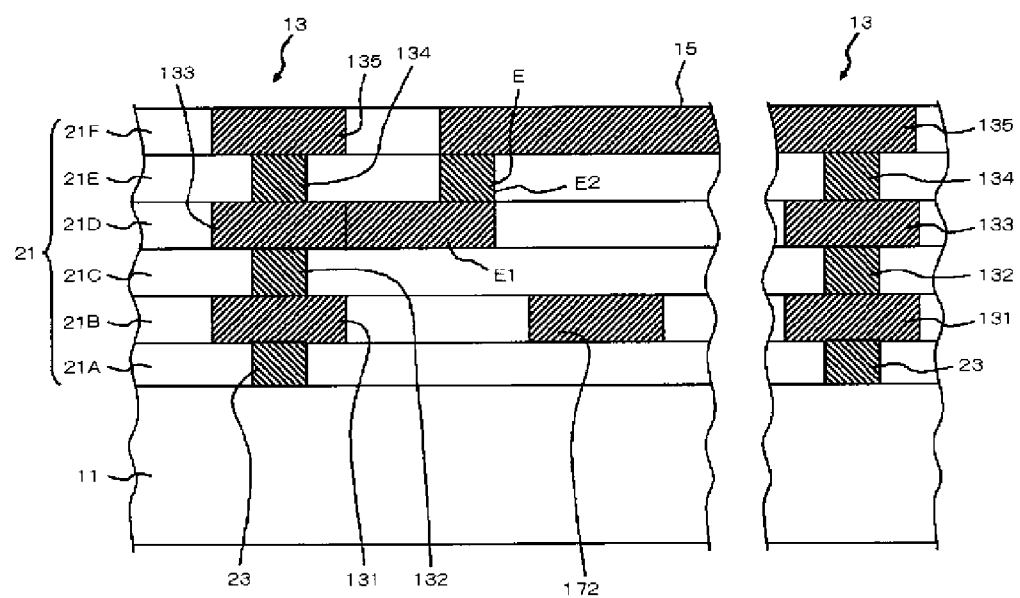
FIG. 12 is a cross-section view of the semiconductor device according to a third embodiment of the invention.

In the first embodiment, the seal ring 13 is insulated from the semiconductor wafer 11 by the first insulating interlayer 21A. On the other hand, in this embodiment, the seal ring 13 is connected to a metallic contact 23 provided in the first insulating interlayer 21A, and is electrically connected to the semiconductor wafer 11, as shown in FIG. 12. The other respects are identical to the first embodiment.

The seal ring 13 and the semiconductor wafer 11 are connected to each other by a plurality of contacts 23 mentioned above. As also shown in a schematic diagram of FIG. 13, this contact 23 connects a portion of the seal ring 13 and the semiconductor wafer 11, but does not surround the periphery of the circuit portion 12, unlike the seal ring 13. The contacts 23 are scattered at predetermined intervals. The polysilicon film 22 is disposed so as to pass between the contacts 23. Meanwhile, the gate insulating film F is formed below the polysilicon film 22 similarly to the above-mentioned embodiment.

Figure 13:
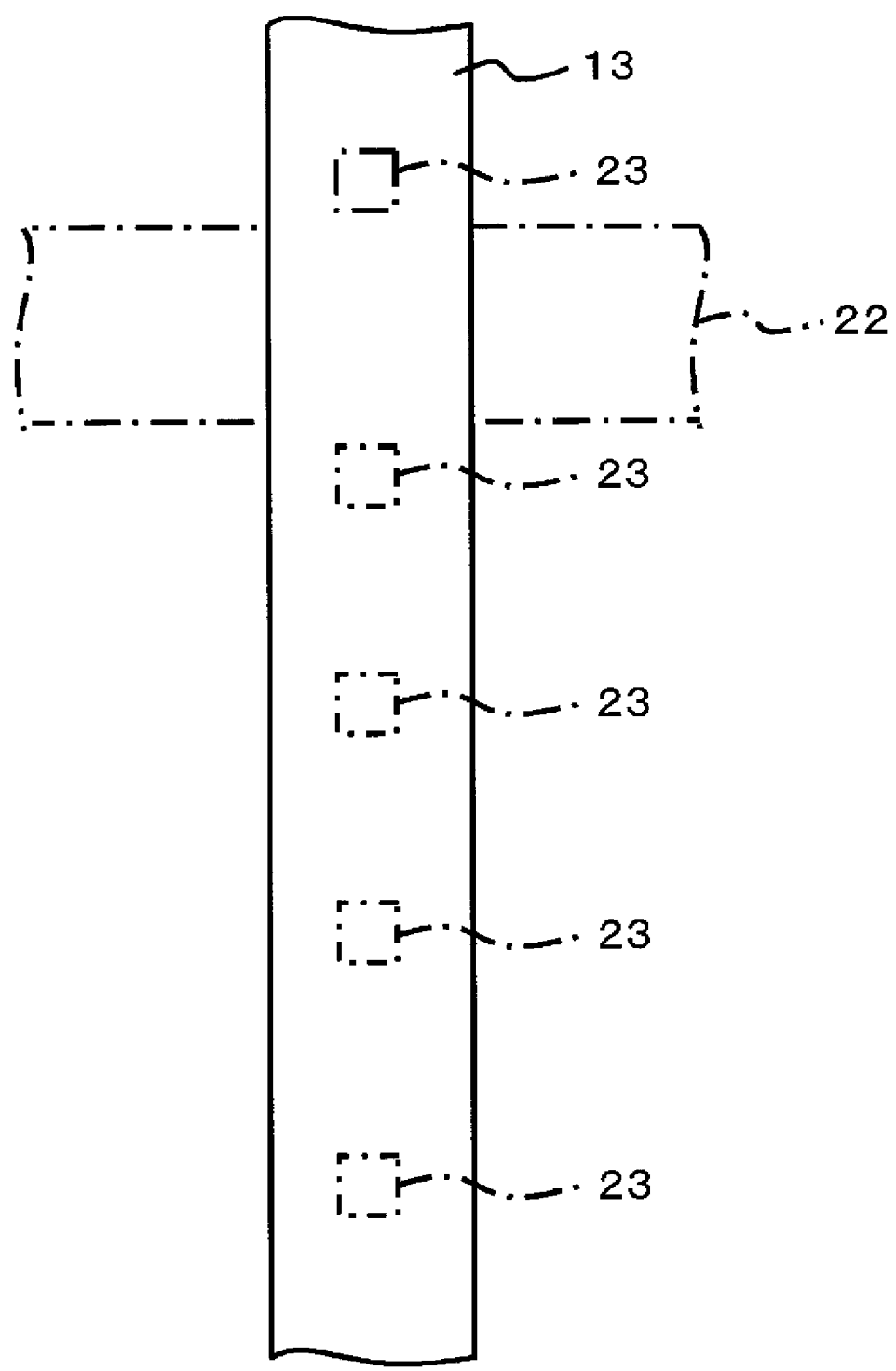
FIG. 13 is a magnified diagram of a portion of a seal ring.

In addition, FIG. 13 is a plan view magnifying and schematically illustrating a portion of the seal ring 13.

The other respects are identical to the first embodiment. Meanwhile, in the embodiment, the same alignment mark 24 as that of the second embodiment may be provided.

With such an embodiment, it is possible to exhibit the same effect as that of the above-mentioned embodiment, and then to exhibit the following effect.

In the embodiment, since the contact 23 is formed in the first insulating interlayer 21A, it is possible to more reliably prevent moisture from permeating the first insulating interlayer 21A.

In addition, since the alignment mark 24 is used as a power supply pad, it is possible to contrive a reduction in manufacturing cost without providing a new power supply pad.

Meanwhile, the invention is not limited to the above-mentioned embodiments, but modifications, improvements and the like within the scope capable of achieving the objects of the invention are included in the invention.

For example, in the first embodiment and the third embodiment, the circuit portion 12 and the second conductive layer 17 are connected through the polysilicon film 22. However, without being limited to this, the circuit portion 12 and the second conductive layer 17 may be connected by the well formed in the surface layer of the semiconductor wafer as in the second embodiment instead of the polysilicon film 22.

Figure 14:
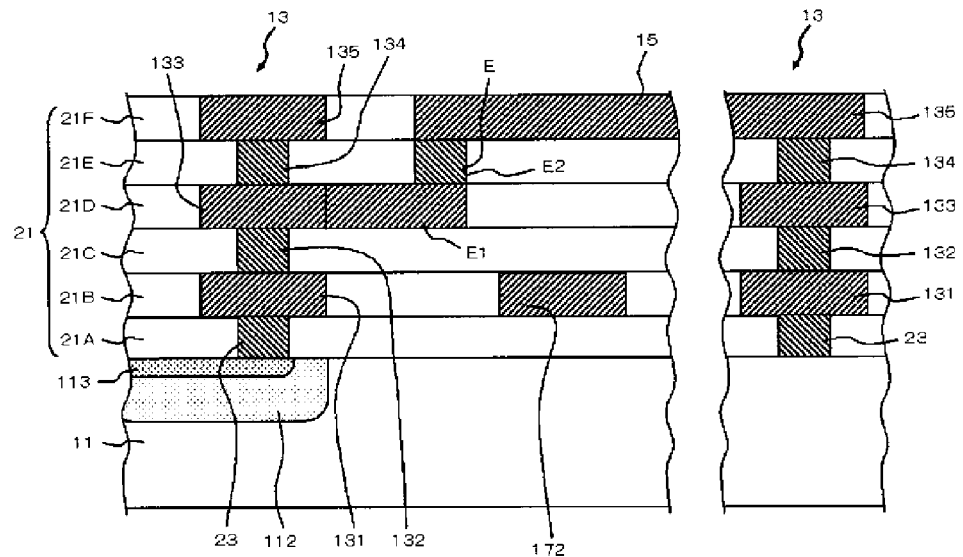
FIG. 14 is a diagram illustrating a modified example of the invention.
Figure 15:
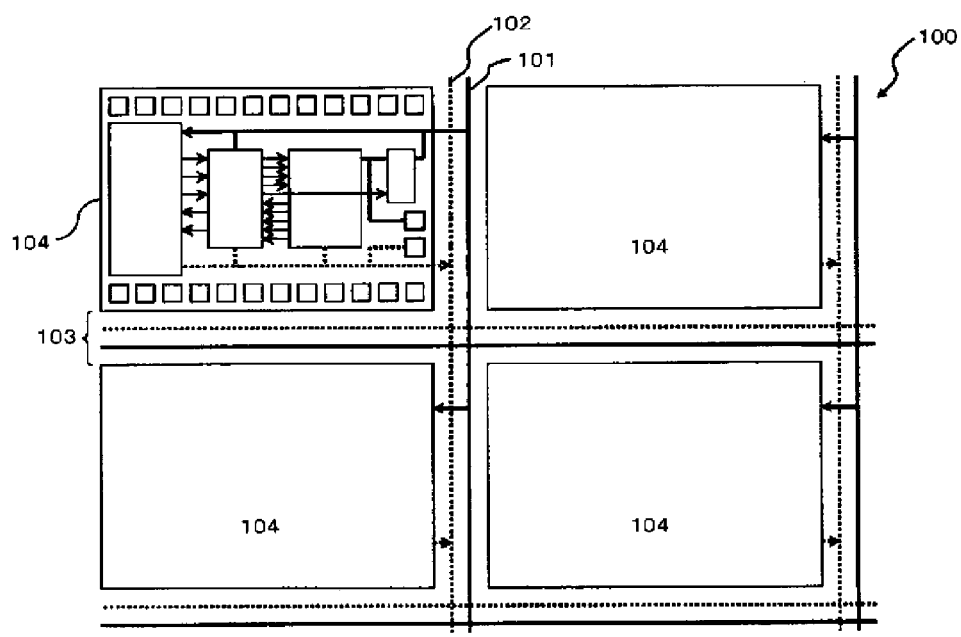
FIG. 15 is a diagram illustrating a semiconductor device according to related art.

For example, in the third embodiment, when the second conductive layer 17 and the circuit portion 12 are connected through the impurity diffused layer 111 as in the second embodiment, both the seal ring 13 and the second conductive layer 17 are connected to the semiconductor wafer 11. Consequently, as shown in FIG. 14, a conductive n-type impurity diffused layer 112 reverse to the semiconductor wafer 11 is formed in the semiconductor wafer 11, and a p-type impurity diffused layer 113 is formed in this impurity diffused layer 112, so that the seal ring 13 and the circuit portion 12 may be connected through the impurity diffused layer 113. Moreover, when the potential of the impurity diffused layer 111 is set to be different from potential of the substrate 11, the conductive n-type impurity diffused layer reverse to the semiconductor wafer 11 is formed, so that the impurity diffused layer 111 may be formed in this n-type impurity diffused layer.

Further, in each of the embodiments mentioned above, the fuse E is provided as a unit which cuts off the connection of the first conductive layer 13 and the first connecting portion 15. However, without being limited to this, a circuit or a switch may be provided as a unit which cuts off the electrical connection of the above-mentioned conductive layer and the above-mentioned connecting portion.

Further, in each of the embodiments mentioned above, the circuit portion 12 of the semiconductor device 1 is configured to receive the test signals from the outside by inductive coupling, but is not limited to this.

The circuit portion 12 of the semiconductor device 1 may perform communication with the outside by capacitive coupling. When communication with the outside is performed by capacitive coupling, communication with the outside may be performed through the pad P without providing an inductor.

For example, the test signals are output to the semiconductor device 1 by generating potential variation at the electrode of the tester side. The communication portion T of the semiconductor device 1 side converts signals from the tester side into electrical signals, and outputs the electrical signals to the circuit portion 12.

Further, although a plurality of communication portions T is connected to the circuit portion 12, only one communication portion T may be connected to a portion of the circuit portions 12 among a plurality of circuit portions.

Further, in each of the embodiments mentioned above, although all of the circuit portions 12 over the semiconductor wafer 11 are electrically connected through the connecting portions, only a portion of the circuit portions may be electrically connected to each other without being limited to this. In addition, for example, there exist a first circuit portion group electrically connected to each other and a second circuit portion group electrically connected to each other, and the first circuit portion group and the second circuit portion group may not be electrically connected to each other.

In such a case, it is possible to perform the testing of the first circuit portion group and the testing of the second circuit portion group separately.

Further, in each of the embodiments mentioned above, although power is supplied through the seal ring 13, and grounding is performed through the second conductive layer 17, for example, grounding may be performed through the seal ring 13, and power may be supplied through the second conductive layer, without being limited to this.

Further, in each of the embodiments mentioned above, although the pad 16 is connected to the first connecting portion 15, the pad 16 may be directly connected to the seal ring 13 without being limited to this. Similarly, the pad 19 may be connected to the second conductive layer 17.

Further, in each of the embodiments mentioned above, although the opposite sides of the seal rings 13 are connected to each other by the first connecting portion 15, and the first connecting portion 15 is across a portion of the scribe region 14A1, for example, angular portions of the seal rings 13 may be connected to each other by the first connecting portion, and the first connecting portion may be across a portion of the scribe region 14A2, without being limited to this.

Similarly, angular portions of the second conductive layers 17 may be connected to each other, and the second connecting portion may be across a portion of the scribe region 14A2.

Further, in the first embodiment, the pad connected to the first connecting portion 15 may be used as an alignment mark 24.

It is apparent that the present invention is not limited to the above embodiment, and may be modified and changed without departing from the scope and spirit of the invention.

What is claimed is:

1. A semiconductor device, comprising:
a semiconductor wafer having a plurality of semiconductor chip forming regions, and a scribe region located between said semiconductor chip forming regions;
a semiconductor chip circuit portion provided in each of said semiconductor chip forming regions of said semiconductor wafer;
a plurality of first conductive layers, provided in each of said semiconductor chip forming regions, which is electrically connected to each of said circuit portions respectively;
a first connecting portion that electrically connects said first conductive layers to each other across a portion of said scribe region; and
a communication portion, connected to said circuit portion, that performs communication with the outside by capacitive coupling or inductive coupling,
wherein an external power supply or grounding pad is connected to at least one of said first conductive layer and said first connecting portion,
wherein said first conductive layers are seal rings, each of which surrounds each of said circuit portions,
wherein an insulating film is provided over said semiconductor wafer,
wherein said seal rings are disposed over said insulating film,
wherein second conductive layers are provided over said insulating film,
each of said second conductive layers is provided inside of each of the semiconductor chip forming regions and is provided outside of each of said seal rings,
wherein said circuit portion and said second conductive layer are connected to each other through a polysilicon film passing the inside of said insulating film past the lower side of said seal ring, and
wherein said second conductive layers are electrically connected to each other by a second connecting portion disposed across a portion of said scribe region.

2. The semiconductor device as set forth in claim 1, wherein said seal ring and said semiconductor wafer are connected to each other by a plurality of contacts provided in said insulating film,
wherein said polysilicon film is disposed to pass through between said contacts when said semiconductor wafer is seen in a plan view.

3. The semiconductor device as set forth in claim 1, wherein said second connecting portion connects opposite regions of said second conductive layers.

* * * * *